(12) United States Patent
Erstad

(10) Patent No.: US 6,356,101 B1
(45) Date of Patent: Mar. 12, 2002

(54) GLITCH REMOVAL CIRCUITRY

(75) Inventor: David Owen Erstad, Minnetonka, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/473,863

(22) Filed: Dec. 28, 1999

(51) Int. Cl.[7] ............................................... H03K 17/16
(52) U.S. Cl. .............................. 326/27; 326/21; 326/86
(58) Field of Search ........................... 326/26, 27, 83, 326/86; 327/15, 34, 36, 170, 261, 263, 392, 400, 310, 551

(56) References Cited

U.S. PATENT DOCUMENTS

| | | | |
|---|---|---|---|
| 4,216,388 A | * 8/1980 | Wilson | 326/21 |
| 5,019,724 A | * 5/1991 | McClure | 326/21 |
| 5,126,588 A | * 6/1992 | Reichmeyer et al. | 326/83 |
| 5,184,032 A | * 2/1993 | Leach | 326/21 |
| 5,198,710 A | * 3/1993 | Houston | 326/21 |
| 5,367,205 A | 11/1994 | Powell | |
| 5,440,178 A | * 8/1995 | McClure | 327/34 |
| 5,748,034 A | * 5/1998 | Ketineni et al. | 327/551 |
| 5,760,612 A | 6/1998 | Ramirez | 327/34 |
| 5,761,612 A | 6/1998 | Ramirez | |
| 6,064,237 A | * 5/2000 | Lee | 327/34 |

FOREIGN PATENT DOCUMENTS

| | | |
|---|---|---|
| EP | 0 264 614 | 4/1988 |
| EP | 0 434 380 A | 6/1991 |

OTHER PUBLICATIONS

Rhyne, Fundamental of Digital Systems Design, pp. 70–71, 1973.*

* cited by examiner

Primary Examiner—Michael Tokar
Assistant Examiner—Don Phu Le
(74) Attorney, Agent, or Firm—Dennis C. Bremer (57) ABSTRACT

A glitch removal circuit is disclosed that removes negative glitches from those signals that are provided to circuit elements that are turned-on by negative glitches (e.g., p-channel transistors), and/or removes positive glitches from those signals that are provided to circuit elements that are turned on by positive glitches (e.g., n-channel transistors). The positive glitches need not be removed from those signals that are provided to the circuit elements that are turned-off by positive glitches (e.g., p-channel transistors), and the negative glitches need not be removed from those signals that are provided to circuit elements that are turned-off by negative glitches (e.g., n-channel transistors). An advantage of the present invention is that both positive and negative glitches can be removed in parallel, rather then serially. This can significantly increase the performance of some circuits, and may reduce the amount of glitch removal circuitry required.

44 Claims, 7 Drawing Sheets

FIG. 7

GLITCH REMOVAL CIRCUITRY

BACKGROUND OF THE INVENTION

The present invention generally relates to electronic data transmission and processing systems, and more particularly, to circuits for reducing or eliminating unwanted signal glitches from such systems.

The signals in most digital systems have two idealized states, namely, a low voltage state and a high voltage state. Unwanted transitions of a signal from a first voltage state to another, and then back to the first is often referred to as a glitch. As an ideal, digital systems are designed to be glitch-free. In practice, however, glitches are difficult to eliminate.

One approach for removing or eliminating glitches from a digital system is shown in U.S. Pat. No. 5,760,612 to Ramirez. Ramirez suggests providing an inertial delay circuit including a negative suppression circuit connected in series with a positive pulse suppression circuit. The negative pulse suppression circuit and positive pulse suppression circuit are respectively configured to pass only negative and positive glitches of an input signal having a pulse width greater than a pre-determined width. The negative pulse suppression circuit passes its input through a delay line and performs a logical OR on its input and the delayed signal. The positive pulse suppression circuit passes its input through a delay line and performs a logical AND on its input and the delayed signal. The glitch removing circuits may include respective pulse width restoring circuits to restore the pulses passing therethrough to their original widths.

A limitation of Ramirez is that the positive and negative glitches are sequentially removed. Both the positive and negative pulse removal circuits of Ramirez have a delay line that delays the signal. The amount of delay depends on the duration of glitches to be removed. Typically, the delay line in each pulse suppression circuit has a delay that roughly corresponds to the maximum glitch duration to be removed. Because the delay associated with both the positive and negative pulse suppression circuits are additive, the performance of a corresponding digital system may be significantly reduced.

Another limitation of Ramirez is that the glitch removal circuit may require a substantial amount of circuitry. The glitch removal circuit of FIG. 5 of Ramirez, for example, requires a negative pulse suppression circuit, a first pulse width restore circuit, a positive pulse suppression circuit, and a second pulse width restore circuit. All of this circuitry is provided for each signal where glitch removal is desired.

SUMMARY OF THE INVENTION

The present invention overcomes many of the limitations of the prior art by providing a glitch removal circuit that removes negative glitches from those signals that are provided to circuit elements that are turned-on by negative glitches (e.g., p-channel transistors), and/or removes positive glitches from those signals that are provided to circuit elements that are turned on by positive glitches (e.g., n-channel transistors).

In many circuits, including CMOS circuits, temporarily turning off the circuit elements that are actively driving an output node does not substantially affect the voltage at the output node. Instead, the output node merely enters a tri-state mode. Once the glitch passes, the circuit element is again turned-on, which actively keeps the output node in the desired state. Thus, it is contemplated that positive glitches need not be removed from those signals that are provided to the circuit elements that are turned-off by positive glitches (e.g., p-channel transistors), and negative glitches need not be removed from those signals that are provided to circuit elements that are turned-off by negative glitches (e.g., n-channel transistors). An advantage of the present invention is that both positive and negative glitches can be removed in parallel, rather than serially. This can significantly increase the performance of some circuits, and may reduce the amount of glitch removal circuitry required.

Another advantage of the present invention is that the positive and negative pulse suppression circuits can be used to reduce or eliminate the crow-bar current produced during a transition by certain circuit types including, for example, output driver circuits. Output driver circuits typically have a relatively large p-channel driver transistor coupled to a relatively large n-channel driver transistor. The gate of the p-channel driver transistor is typically coupled to the gate of the n-channel driver transistor, and both are controlled by a common input signal. During a transition of the input signal, the p-channel driver transistor and the n-channel driver transistor are both on at least momentarily, producing a crow-bar current from the power supply to ground. In some cases, the crow-bar current can be relatively large, and can provide significant noise on the power bus structure of the device particularly when several output drivers are switched simultaneously.

The negative pulse suppression circuit of the present invention can be used to delay negative transitions at the gate of the p-channel transistor while not delaying positive transitions. Likewise, the positive pulse suppression circuit can be used to delay positive transitions at the gate of the n-channel transistor while not delaying negative transitions. Accordingly, during a low-to-high transition for example, the p-channel driver transistor may be turned off before the n-channel driver transistor is turned on. Likewise, during a high-to-low transition, the n-channel driver transistor may be turned off before the p-channel driver transistor is turned on. By turning off the "on" transistor before turning on the "off" transistor, the crow-bar current produced by an output driver circuit may be significantly reduced or eliminated. This may significantly reduce the noise on the power bus structure of the device.

DETAILED DESCRIPTION OF THE PREFERRED EMBODIMENTS

Figure 1:
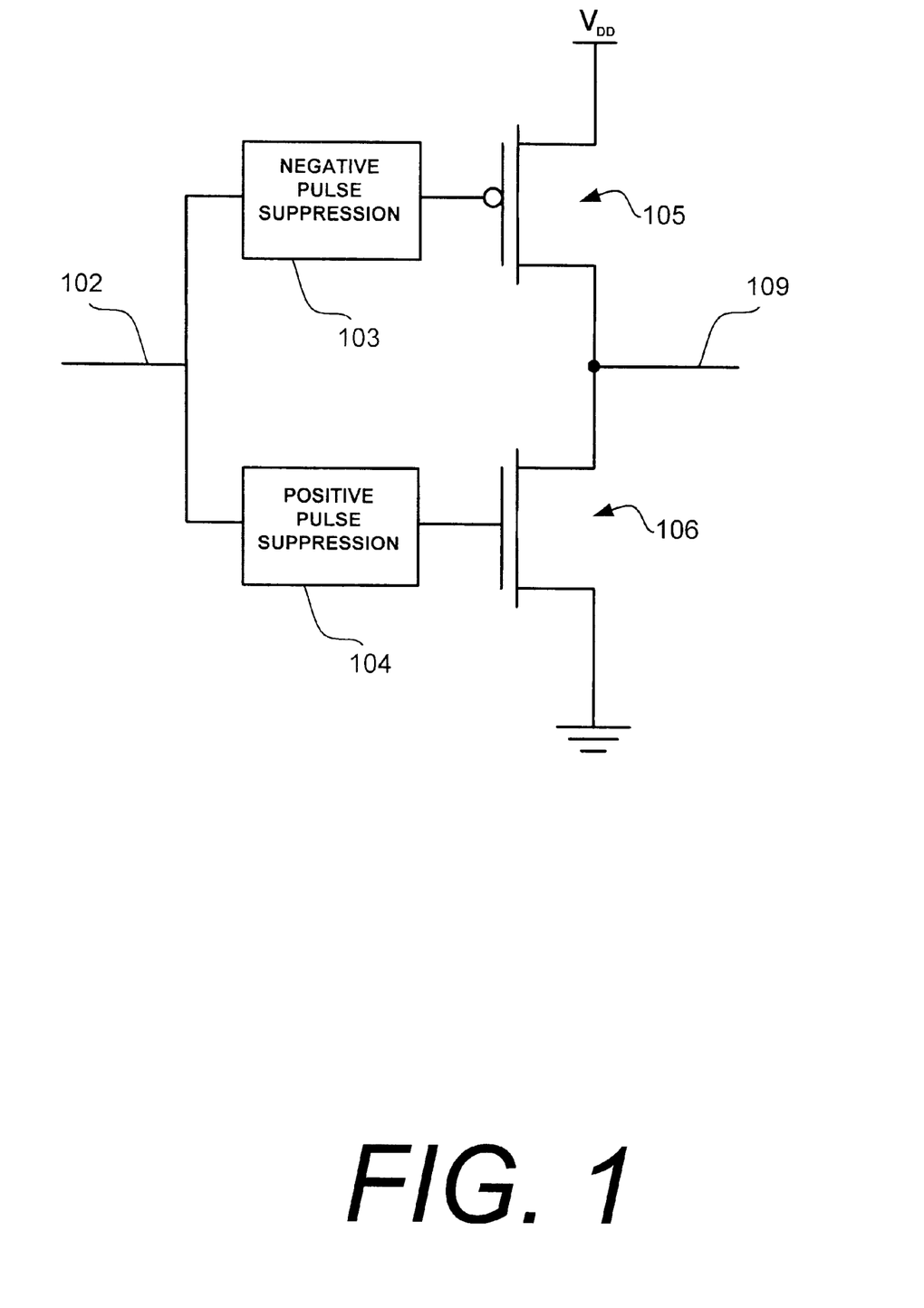
FIG. 1 is a schematic diagram of a first illustrative embodiment of the present invention.

FIG. 1 is a schematic diagram of a first illustrative embodiment of the present invention. In this embodiment, a positive pulse suppression circuit and a negative pulse suppression circuit are used in conjunction with a conventional inverter. The inverter includes a p-channel transistor 105 coupled in series with an n-channel transistor 106. The input 102 of the inverter is coupled to negative pulse suppression circuit 103 and a positive pulse suppression circuit 104, as shown. The negative pulse suppression circuit 103 is coupled between the input 102 and the gate of the p-channel transistor 105. The positive pulse suppression circuit 104 is coupled between the input 102 and the gate of the n-channel transistor 106.

The negative pulse suppression circuit 103 preferably prevents negative glitches from reaching the gate of the p-channel transistor 105, but need not prevent positive glitches from reaching the gate of the p-channel transistor 105. It is recognized that positive glitches at the gate of p-channel transistor 105 may not substantially affect the voltage at the output terminal 109.

To illustrate this further, assume that the input 102 is initially low. In this state, the p-channel transistor 105 is "on", driving the output terminal 109 high. A positive glitch on the input 102 causes the gate of the p-channel transistor 105 to go high (assuming no positive pulse suppression). This turns off the p-channel transistor 105. However, the capacitance on the output terminal 109, which is often provided by the input of a following gate, tends to keep the voltage on the output terminal 109 relatively constant. Once the positive glitch passes, the input 102 returns to the initial low state, and the p-channel transistor 105 again actively drives the output terminal 109 high. Accordingly, positive glitches at the gate of the p-channel transistor 105 may have little impact on the voltage at the output terminal 109, at least for those technologies that have relatively high input impedance devices that draw little or no DC current from the output terminal 109.

The negative pulse suppression circuit 104 preferably prevents positive glitches from reaching the gate of the n-channel transistor 106, but need does not prevent negative glitches from reaching the gate of the n-channel transistor 106. It is recognized that negative glitches at the gate of n-channel transistor 106 may not substantially affect the voltage at the output terminal 109.

Again, and to illustrate this, assume that the input 102 is initially high. In this state, the n-channel transistor 106 is "on", driving the output terminal 109 low. A negative glitch on the input 102 causes the gate of the n-channel transistor 106 to go low (assuming no negative pulse suppression). This turns off the n-channel transistor 106. However, the capacitance on the terminal 109, which is often provided by the input of a following gate, tends to keep the voltage on the output terminal 109 relatively constant. Once the negative glitch passes, the input 102 returns to the initial high state, and the n-channel transistor 106 again actively drives the output terminal 109 high. Accordingly, negative glitches at the gate of the n-channel transistor 106 may have little impact on the voltage at the output terminal 109, at least for those technologies that have relatively high input impedance devices that draw little or no DC current from the output terminal 109.

By only preventing negative glitches from reaching the p-channel transistor 105 and positive glitches from reaching the n-channel transistor 106, the positive and negative glitches may be removed in parallel, rather than serially. This may significantly reduce the amount of delay contributed by the glitch removal circuitry, and may in some circumstances, significantly reduce the amount of glitch removal circuitry required.

Another use for the negative and positive pulse suppression circuits of the present invention is to reduce or eliminate crow-bar current produced during a transition of certain circuits including, for example, output driver circuits. FIG. 1 schematically shows an illustrative output driver circuit. The negative pulse suppression circuit 103 may delay the negative transitions of input 102 while not delaying the positive transitions. Likewise, the positive pulse suppression circuit 104 may delay the positive transitions of input 102 while not delaying the negative transitions. Accordingly, during a low-to-high transition on input 102, the p-channel driver transistor 105 may be turned off before the n-channel driver transistor 106 is turned on. Likewise, during a high-to-low transition on input 102, the n-channel driver transistor 106 may be turned off before the p-channel driver transistor 105 is turned on. By turning off the "on" transistor before turning on the "off" transistor, the crow-bar current produced by an output driver circuit may be significantly reduced or eliminated. This may significantly reduce the noise on the power bus structure of the device.

Figure 2:
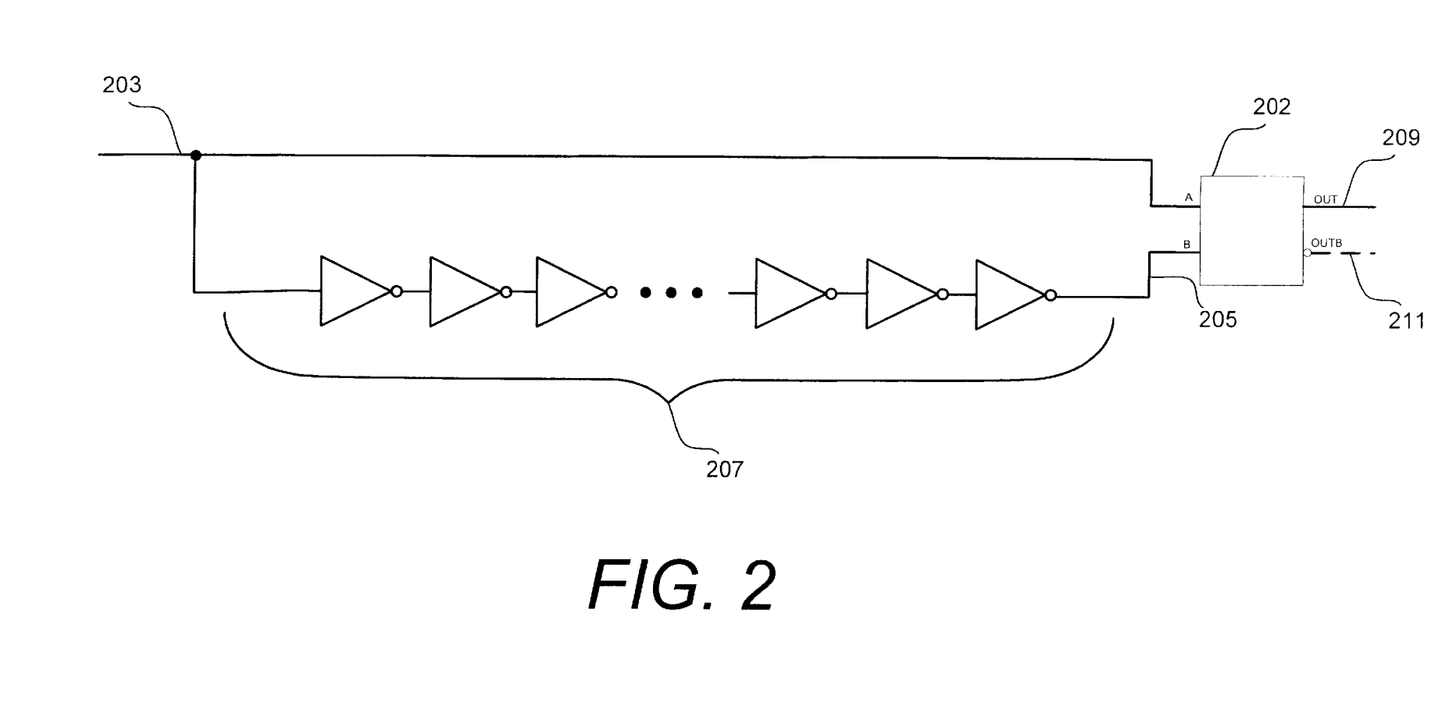
FIG. 2 is a schematic diagram of an illustrative pulse suppression circuit of the present invention.

FIG. 2 is a schematic diagram of an illustrative pulse suppression circuit of the present invention. The pulse suppression circuit includes a logic block 202 having an input terminal "A" 203 and an input terminal "B" 205. The input data on input terminal "A" 203 passes through a delay line 207 before arriving at the input terminal "B" 205 of the logic block. The delay line is preferably non-inverting. The logic block 202 may provide a non-inverting output 209, an inverting output 211, or both.

Figure 3:
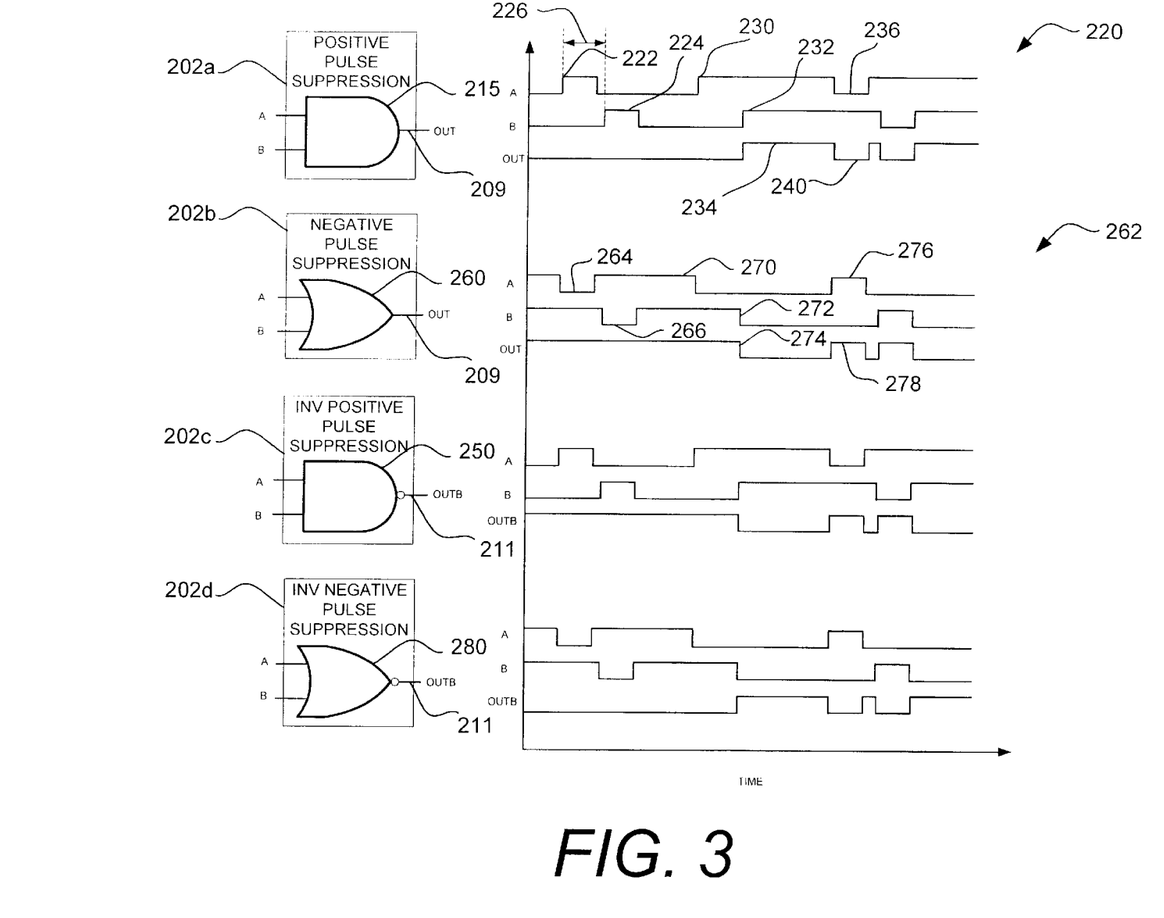
FIG. 3 is a diagram showing illustrative logic functions for use with the pulse suppression circuit of FIG. 2.

The pulse suppression circuit of FIG. 2 can provide a negative pulse suppression circuit, a positive pulse suppression circuit, an inverting negative pulse suppression circuit or an inverting pulse suppression circuit, depending on the logic function of the logic block 202. FIG. 3 is a diagram showing illustrative logic functions for use with the pulse suppression circuit of FIG. 2.

If the logic block 202 of FIG. 2 includes an AND gate 215, as shown at 202a, a positive pulse suppression circuit is provided. An illustrative timing chart for the positive pulse suppression circuit is generally shown at 220. Initially, the input signal 203 of FIG. 2 is low, but then provides a positive glitch 222. Positive glitch 222 passes immediately to the input terminal "A" of positive pulse suppression block 202a. Positive glitch 222 also passes through delay line 207 of FIG. 2 before providing a delayed positive glitch 224 to the input terminal "B" of positive pulse suppression block 202a. So long as the delay line 207 provides a delay 226 that is longer than the duration of the positive glitch, the output of AND gate 215 remains low. Thus, positive glitch 226 is rejected.

The illustrative positive pulse suppression circuit does not, however, reject a negative glitch. To illustrate this further, the illustrative timing chart 220 shows the input signal 203 going high, which immediately causes the input terminal "A" of the positive pulse suppression block 202a to go high as shown at 230. This transition travels through the delay line 207 of FIG. 2, and arrives at the input terminal "B" of positive pulse suppression block 202a, as shown at 232. This causes the output terminal 209 to go high, as shown at 234.

A negative glitch 236 then is shown on the input signal 203. Negative glitch 236 passes immediately to the input terminal "A" of positive pulse suppression block 202a, which causes the output terminal 209 of the AND gate 215 to also go low, as shown at 240. Thus, negative glitch 236 is not rejected by the positive pulse suppression block 202a.

If the logic block 202 of FIG. 2 includes an NAND gate 250, as shown at 202c, an inverting positive pulse suppression circuit is provided. The inverting positive pulse suppression circuit operates similar to the positive pulse suppression circuit described above, except the voltage at the output terminal is inverted. In some technologies, such as the CMOS technology, it is more efficient to implement a NAND gate 250 than an AND gate 215. Thus, it may be more efficient to implement an inverting positive pulse suppression circuit than a non-inverting positive pulse suppression circuit as described above.

If the logic block 202 of FIG. 2 includes an OR gate 260, as shown at 202b, a negative pulse suppression circuit is provided. An illustrating timing chart for the negative pulse suppression circuit is generally shown at 262. Initially, the input signal 203 of FIG. 2 is high, but then provides a negative glitch 264. Negative glitch 264 passes immediately to the input terminal "A" of negative pulse suppression block 202b. Negative glitch 264 also passes through delay line 207 of FIG. 2 before providing a delayed negative glitch 266 to the input terminal "B" of negative pulse suppression block 202b. So long as the delay line 207 provides a delay that is longer than the duration of the negative glitch, the output of OR gate 260 remains high. Thus, negative glitch 264 is rejected.

The illustrative negative pulse suppression circuit does not, however, reject a positive glitch. To illustrate this further, the illustrative timing chart 262 shows the input signal 203 going low, which immediately causes the input terminal "A" of the negative pulse suppression block 202b to go low, as shown at 270. This transition travels through the delay line 207 of FIG. 2, and arrives at the input terminal "B" of negative pulse suppression block 202b, as shown at 272. This causes the output terminal 209 to go low, as shown at 274.

A positive glitch 276 is then shown on the input signal 203. Positive glitch 276 passes immediately to the input terminal "A" of negative pulse suppression block 202b, which causes the output terminal 209 of the OR gate 260 to also go high, as shown at 278. Thus, positive glitch 276 is not rejected by the negative pulse suppression block 202b.

Finally, if the logic block 202 of FIG. 2 includes a NOR gate 280, as shown at 202d, an inverting negative pulse suppression circuit is provided. The inverting negative pulse suppression circuit operates similar to the negative pulse suppression circuit described above, except the voltage at the out terminal is inverted. In some technologies, such as the CMOS technology, it is more efficient to implement a NOR gate 280 than an OR gate 260. Thus, it may be more efficient to implement an inverting negative pulse suppression circuit than a non-inverting negative pulse suppression circuit as described above.

Figure 4:
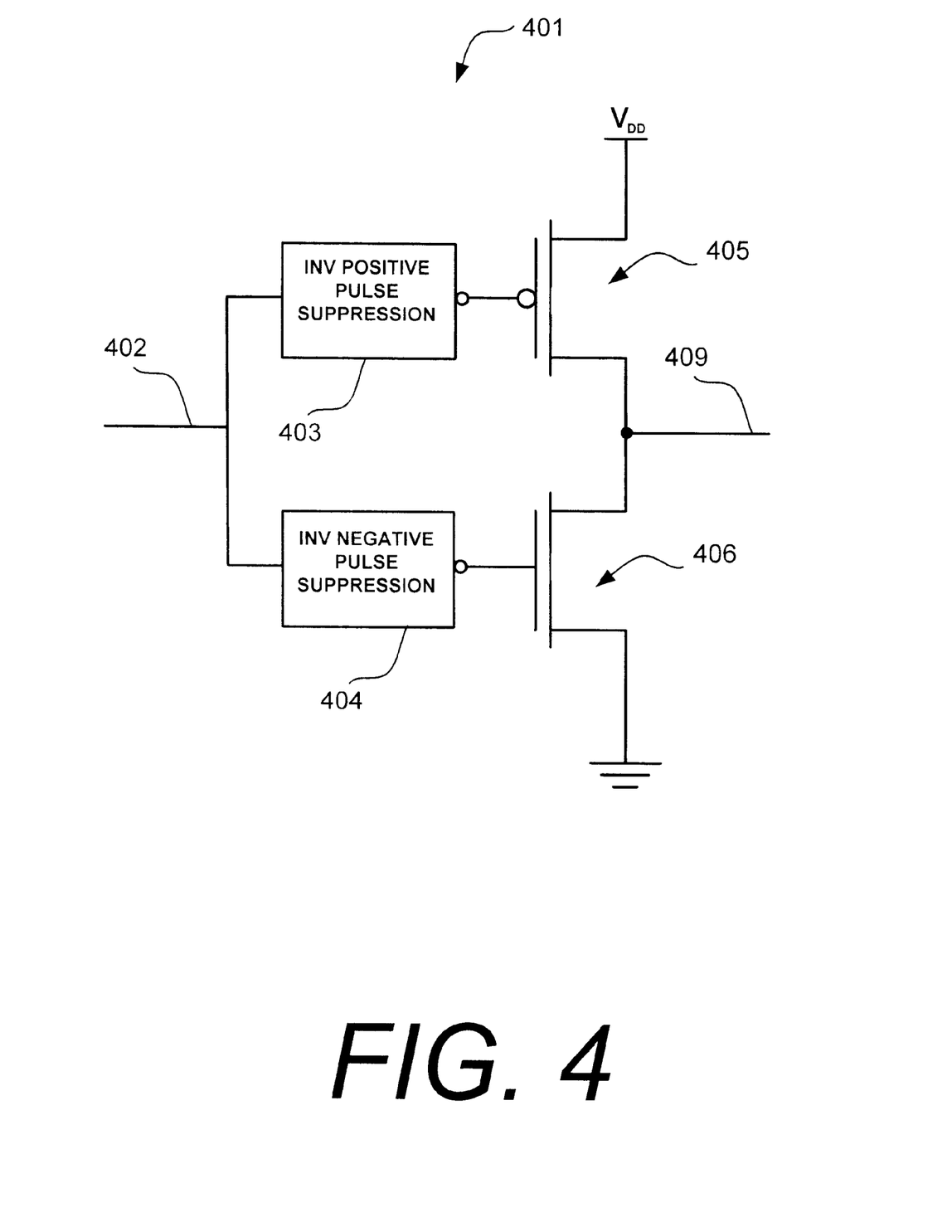
FIG. 4 is a schematic diagram of another illustrative embodiment of the present invention.

FIG. 4 is a schematic diagram of another illustrative embodiment of the present invention. The embodiment is similar to that described above with respect to FIG. 1 except the pulse suppression circuits are inverting. Because the pulse suppression circuits themselves incorporate an inverting function, the circuit as a whole operates as a glitch rejecting buffer circuit only, without the overall inverting function of FIG. 2.

Data enters the circuit on data input terminal 402. The data signal simultaneously enters inverting positive pulse suppression circuit 403 and inverting negative pulse suppression circuit 404. In contrast to the pulse suppression circuits of FIG. 2, the pulse suppression circuits 403 and 404 carry out an inverting function in addition to glitch rejection.

As indicated above, this may be effected by, for example, replacing AND gate 215 of FIG. 3 with a NAND gate 250, and replacing OR gate 260 with NOR gate 280.

The inverting positive pulse suppression circuit 403 outputs an inverted signal that is free of inverted positive glitches (i.e., negative glitches) at the gate of p-channel transistor 405. As discussed above, inverted negative glitches (i.e., positive glitches) at the gate of p-channel transistor 405 will not cause erroneous data to be actively driven to the data output terminal 409. Likewise, the inverting negative pulse suppression circuit 404 outputs an inverted signal that is free of inverted negative glitches (i.e., positive glitches) at the gate of n-channel transistor 406. As discussed above, inverted positive glitches (i.e., negative glitches) at the gate of n-channel transistor 406 will not cause erroneous data to be actively driven to the data output terminal 409.

Figure 5:
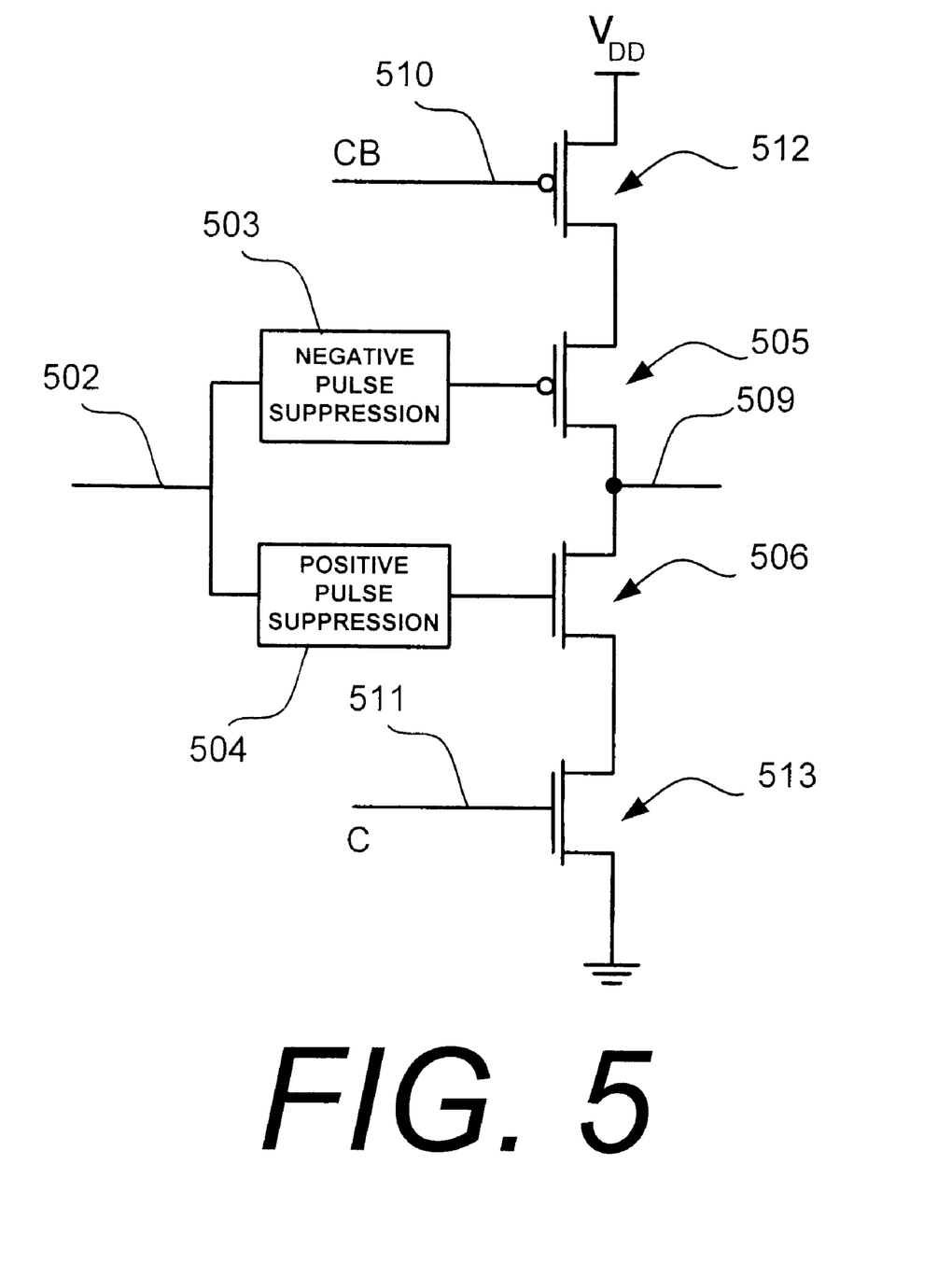
FIG. 5 is a schematic diagram of yet another illustrative embodiment of the present invention.

FIG. 5 is a schematic diagram of yet another illustrative embodiment of the present invention. This embodiment is similar to the basic inverter embodiment of FIG. 2, but further includes enable transistors 512 and 513. This type of clocked inverter may be used in a flip-flop, for example. The data input signal enters the circuit on input terminal 502, and is simultaneously processed by negative pulse suppression circuit 503 and positive pulse suppression circuit 504. The resulting signals are sent to the gate terminals of p-channel transistor 505 and n-channel transistor 506, respectively.

In this illustrative embodiment, the input signal cannot be driven to the data output terminal 509 until the clock signal 511 and clock-bar signal 510 are activated. When the clock signal 511 is low and the clock-bar signal 510 is high, the data output terminal 509 is tri-stated. When the clock signal 511 is high and the clock-bar signal 510 is low, the data input signal is inverted and driven to the data output terminal 509.

It is contemplated that a negative pulse suppression circuit (not shown) may be provided between the clock-bar signal 510 and the gate of p-channel transistor 512. It is also contemplated that a positive pulse suppression circuit (not shown) may be provided between the clock signal 511 and the gate of n-channel transistor 513. Finally, it is contemplated that one or both of the negative pulse suppression circuit 503 and the positive pulse suppression circuit 504 may be removed, if desired.

Figure 6:
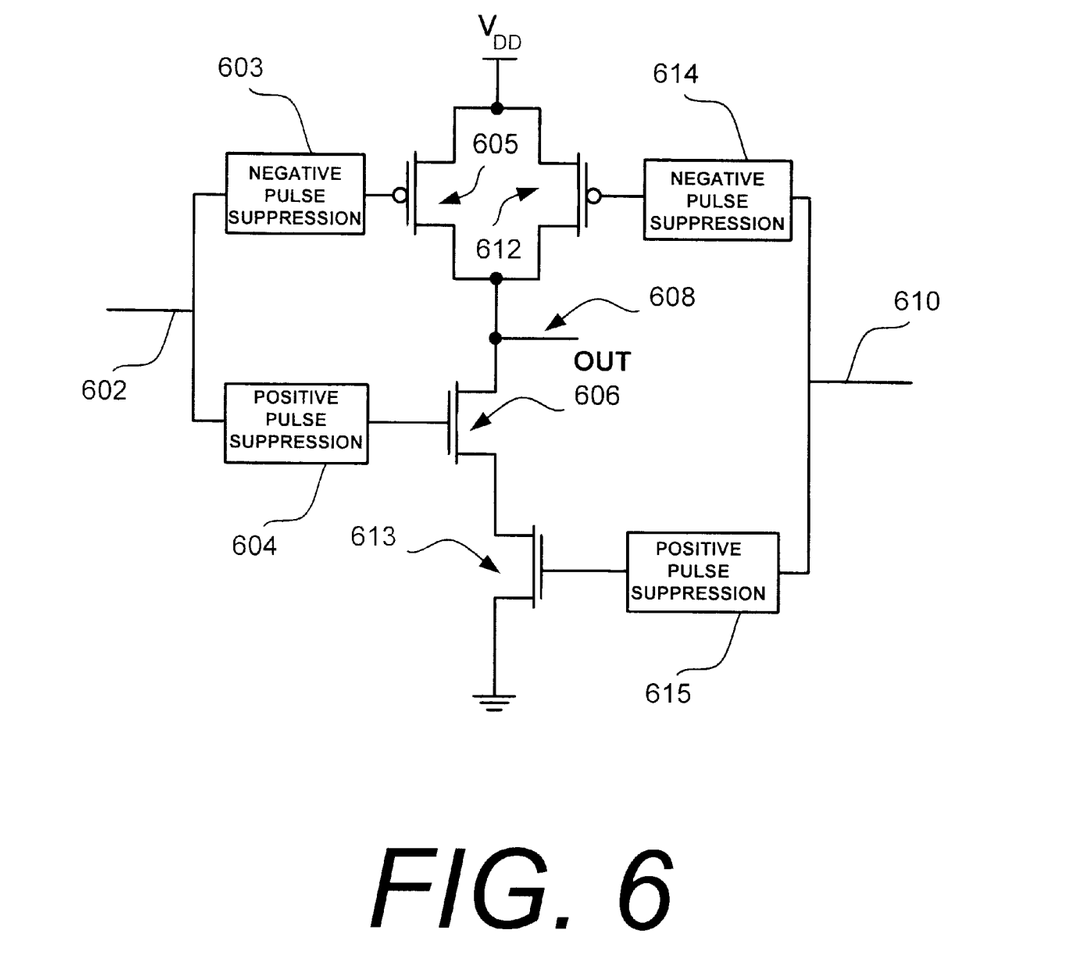
FIG. 6 is a schematic diagram of an illustrative NAND gate incorporating the present invention.

FIG. 6 is a schematic diagram of an illustrative NAND gate incorporating the present invention. The NAND gate is generally shown as 601. A first data input signal enters on terminal 602, and is simultaneously sent to negative pulse suppression circuit 603 and positive pulse suppression circuit 604. The negative pulse suppression circuit 603 provides a signal with the negative glitches removed to the gate of p-channel transistor 605. The positive pulse suppression circuit 604 provides a signal with the positive glitches removed to the gate of n-channel transistor 606. A second data input signal enters on terminal 610, and is simultaneously sent to negative pulse suppression circuit 614 and positive pulse suppression circuit 615. The negative pulse suppression circuit 614 provides a signal with the negative glitches removed to the gate of p-channel transistor 612. The positive pulse suppression circuit 615 provides a signal with the positive glitches removed to the gate of n-channel transistor 613.

The NAND gate of FIG. 6 is depicted with non-inverting pulse suppression circuits. It is contemplated, however, that the NAND gate may be implemented with inverting pulse suppression circuits. If the NAND gate is implemented with inverting pulse suppression circuits, similar to pulse suppression circuits 403 and 404 depicted in FIG. 4, the negative pulse suppression circuits 603 and 614 may be replaced with inverting positive pulse suppression circuits and the positive pulse suppression circuits 604 and 615 may be replaced with inverting negative pulse suppression circuits. It is also contemplated that the pulse suppression circuits may be supplied to only those inputs where desired.

Figure 7:
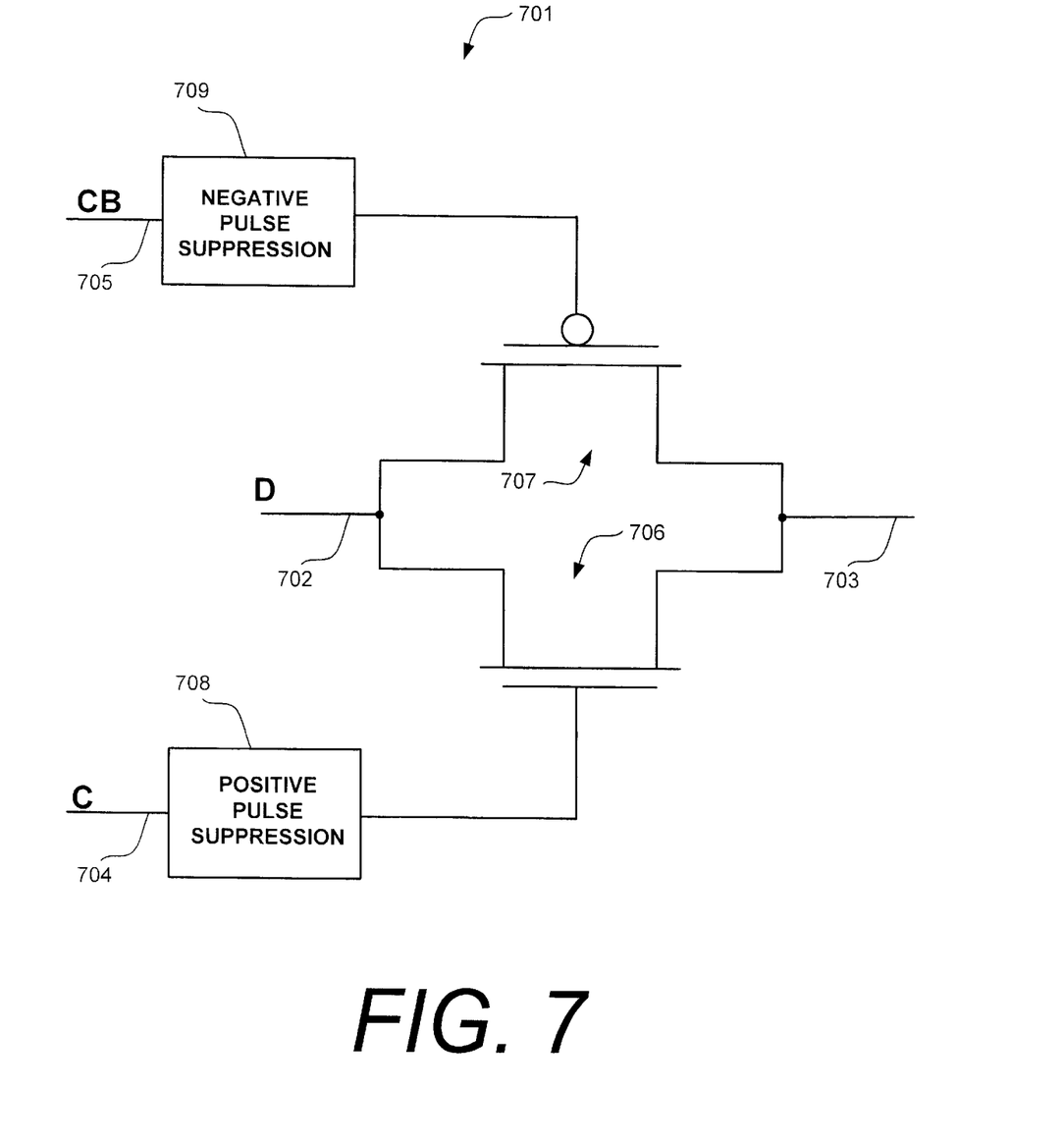
FIG. 7 is a schematic diagram of an illustrative pass gate incorporating the present invention.

FIG. 7 is a schematic diagram of an illustrative pass gate incorporating the present invention. The illustrative pass gate is generally shown at 701, and is controlled by two complementary clock signals including clock signal 704 and clock-bar signal 705. Clock signal 704 is provided to the gate of n-channel transistor 706 through positive pulse suppression circuit 708. Likewise, clock-bar signal 705 is provided to the gate of the p-channel transistor 707 through the negative pulse suppression circuit 709.

A data input signal is provided to the pass gate on terminal 702, and is passed through to the data output terminal 703 if the clock signal 704 is high and the clock-bar signal 705 is low. During normal operation, the rising edge of the clock signal 704 and falling edge of the clock-bar signal 705 causes both transistors 706 and 707 to turn-on. When this condition holds, the data signal 702 passes through transistors 706 and 707 to output terminal 703. A negative glitch on the clock signal 704 or a positive glitch on the clock-bar signal will merely temporarily turn-off n-channel transistor 706 or p-channel transistor 707, respectively. However, the voltage at the output terminal 703 will remain relatively constant because of the capacitance on the output terminal 703 and the drive through the other pass transistor.

When the clock signal 704 is low and the clock-bar signal 705 is high, both the n-channel transistor 706 and the p-channel transistor 707 are off. If one or both of the n-channel transistor 706 can p-channel transistor 707 were to turn-on, the data state on the data input terminal 702 would be actively driven to the data output terminal 703. For this reason, all positive glitches on the clock signal 704 are removed by the positive pulse suppression circuit 708, and all negative glitches on the clock-bar signal 705 are removed by negative pulse suppression circuit 709.

It is contemplated that the negative pulse suppression circuit 709 and the positive pulse suppression circuit 708 may be replaced with an inverting positive pulse suppression circuit and an inverting negative pulse suppression circuit, respectively. In this embodiment, the clock-bar signal 705 can be provided to the inverting negative pulse suppression circuit, and the clock signal 704 can be provided to the inverting positive pulse suppression circuit to retain the same function.

While an inverter, buffer, tri-stateable inverter, NAND gate and pass gate are explicitly shown and described herein, it is contemplated that the present invention may be applied to any type of logic gate or storage element.

Having thus described the preferred embodiment of the present invention, those of skill in the art will readily appreciate that the teachings found herein may be applied to yet other embodiments within the scope of the claims hereto attached.

What is claimed is:

1. A digital circuit having an input comprising:
   a p-channel transistor having a gate; and,
   a non-inverting negative glitch suppressor coupled between the input of the digital circuit and the gate of the p-channel transistor, wherein the non-inverting negative glitch suppressor prevents negative glitches but not positive glitches at the gate of the p-channel transistor.

2. The digital circuit of claim 1 wherein the non-inverting negative glitch suppressor has an input terminal and an output terminal, and wherein the non-inverting negative glitch suppressor includes:
   an OR gate having a first input terminal, a second input terminal, and an output terminal, wherein the first input terminal of the OR gate is coupled to the input terminal of the non-inverting negative glitch suppressor, and wherein the output terminal of the OR gate is coupled to the output terminal of the non-inverting negative glitch suppressor; and,
   a delay circuit having an input terminal and an output terminal, wherein the input terminal of the delay circuit is coupled to the input terminal of the non-inverting negative glitch suppressor, and wherein the output terminal of the delay circuit is coupled to the second input terminal of the OR gate.

3. A digital circuit having an input comprising:
   an n-channel transistor having a gate; and,
   a non-inverting positive glitch suppressor coupled between the input of the digital circuit and the gate of the n-channel transistor, wherein the non-inverting positive glitch suppressor prevents positive glitches but not negative glitches at the gate of the n-channel transistor.

4. The digital circuit of claim 3 wherein the non-inverting positive glitch suppressor has an input terminal and an output terminal, and wherein the non-inverting positive glitch suppressor includes:
   an AND gate having a first input terminal, a second input terminal, and an output terminal, wherein the first input terminal of the AND gate is coupled to the input terminal of the non-inverting positive glitch suppressor, and wherein the output terminal of the AND gate is coupled to the output terminal of the non-inverting positive glitch suppressor; and,
   a delay circuit having an input terminal and an output terminal, wherein the input terminal of the delay circuit is coupled to the input terminal of the non-inverting positive glitch suppressor, and wherein the output terminal of the delay circuit is coupled to the second input terminal of the AND gate.

5. A digital circuit having an input comprising:
   a p-channel comprising one or more transistors;
   an n-channel comprising one or more transistors;
   a negative glitch suppressor coupled between the input of the digital circuit and the p-channel but not the n-channel, wherein the negative glitch suppressor prevents negative glitches at the p-channel; and
   a positive glitch suppressor coupled between the input of the digital circuit and the n-channel but not the p-channel, wherein the positive glitch suppressor prevents positive glitches at the n-channel.

6. The digital circuit of claim 5 wherein the p-channel comprising a transistor having a source, a drain, and a gate, and wherein the negative glitch suppressor is coupled between the gate and the input of the digital circuit.

7. The digital circuit of claim 5 wherein the n-channel comprises a transistor having a source, a drain, and a gate, and wherein the positive glitch suppressor is coupled between the gate and the input of the digital circuit.

8. The digital circuit of claim 5 wherein the negative glitch suppressor is non-inverting.

9. The digital circuit of claim 8 wherein the negative glitch suppressor has an input terminal and an output terminal, and wherein the negative glitch suppressor includes:

an OR gate having a first input terminal, a second input terminal, and an output terminal, wherein the first input terminal of the OR gate is coupled to the input terminal of the negative glitch suppressor, and wherein the output terminal of the OR gate is coupled to the output terminal of the negative glitch suppressor; and a delay circuit having an input terminal and an output terminal, wherein the input terminal of the delay circuit is coupled to the input terminal of the negative glitch suppressor, and wherein the output terminal of the delay circuit is coupled to the second input terminal of the OR gate.

10. The digital circuit of claim 5 wherein the negative glitch suppressor is inverting.

11. The digital circuit of claim 10 wherein the negative glitch suppressor has an input terminal and an output terminal, and wherein the negative glitch suppressor includes:

a NOR gate having a first input terminal, a second input terminal, and an output terminal, wherein the first input terminal of the NOR gate is coupled to the input terminal of the negative glitch suppressor, and wherein the output terminal of the NOR gate is coupled to the output terminal of the negative glitch suppressor; and, a delay circuit having an input terminal and an output terminal, wherein the input terminal of the delay circuit is coupled to the input terminal of the negative glitch suppressor, and wherein the output terminal of the delay circuit is coupled to the second input terminal of the NOR gate.

12. The digital circuit of claim 5 wherein the positive glitch suppressor is non-inverting.

13. The digital circuit of claim 12 wherein, the positive glitch suppressor has an input terminal and an output terminal, and wherein the positive glitch suppressor includes:

an AND gate having a first input terminal, a second input terminal, and an output terminal, wherein the first input terminal of the AND gate is coupled to the input terminal of the positive glitch suppressor, and wherein the output terminal of the AND gate is coupled to the output terminal of the positive glitch suppressor; and, a delay circuit having an input terminal and an output terminal, wherein the input terminal of the delay circuit is coupled to the input terminal of the positive glitch suppressor, and wherein the output terminal of the delay circuit is coupled to the second input terminal of the AND gate.

14. The digital circuit of claim 5 wherein the positive glitch suppressor is inverting.

15. The digital circuit of claim 14 wherein the positive glitch suppressor has an input terminal and an output terminal, and wherein the positive glitch suppressor includes:

a NAND gate having a first input terminal, a second input terminal, and an output terminal, wherein the first input terminal of the NAND gate is coupled to the input terminal of the positive glitch suppressor, and wherein the output terminal of the NAND gate is coupled to the output terminal of the positive glitch suppressor; and, delay circuit having an input terminal and an output terminal, wherein the input terminal of the delay circuit is coupled to the input terminal of the positive glitch suppressor, and wherein the output terminal of the delay circuit is coupled to the second input terminal of the NAND gate.

16. The digital circuit of claim 5 wherein the digital circuit performs an inverting function.

17. The digital circuit of claim 5 wherein the digital circuit performs an AND and a NAND function.

18. The digital circuit of claim 5 wherein the digital circuit performs an OR and a NOR function.

19. The digital circuit of claim 5 wherein the digital circuit performs a storage function.

20. The digital circuit of claim 5 wherein the digital circuit comprises a latch.

21. The digital circuit of claim 5 wherein the digital circuit comprises a register.

22. The digital circuit, wherein the digital circuit has only two states, wherein the digital circuit has an input, and wherein the digital circuit comprises:

a p-channel;

an n-channel;

a negative glitch suppressor coupled to the input of the digital circuit and to the p-channel but not to the n-channel, wherein the negative glitch suppressor prevents negative glitches in the p-channel a positive glitch suppressor coupled to the input of the digital circuit and to the n-channel, wherein the positive glitch suppressor prevents positive glitches in the n-channel.

23. The digital circuit of claim 22 wherein the p-channel comprises a transistor having a source, a drain, and a gate, and wherein the negative glitch suppressor is coupled between the gate and the input of the digital circuit.

24. The digital circuit of claim 22 wherein the n-channel comprises a transistor having a source, a drain, and a gate, and wherein the positive glitch suppressor is coupled between the gate and the input of the digital circuit.

25. The digital circuit of claim 22 wherein the negative glitch suppressor is non-inverting.

26. The digital circuit of claim 25 wherein the negative glitch suppressor has an input terminal and an output terminal, and wherein the negative glitch suppressor, includes:

an OR gate having a first input terminal, a second input terminal, and an output terminal, wherein the first input terminal of the OR gate is coupled to the input terminal of the negative glitch suppressor, and wherein the output terminal of the OR gate is coupled to the output terminal of the negative glitch suppressor; and, a delay circuit having an input terminal and an output terminal, wherein the input terminal of the delay circuit is coupled to the input terminal of the negative glitch suppressor, and wherein the output terminal of the delay circuit is coupled to the second input terminal of the OR gate.

27. The digital circuit of claim 22 wherein the negative glitch suppressor is inverting.

28. The digital circuit of claim 27 wherein the negative glitch suppressor has an input terminal and an output terminal, and wherein the negative glitch suppressor includes:

a NOR gate having a first input terminal, a second input terminal, and an output terminal, wherein the first input terminal of the NOR gate is coupled to the input terminal of the negative glitch suppressor, and wherein the output terminal of the NOR gate is coupled to the output terminal of the negative glitch suppressor; and, a delay circuit having an input terminal and an output terminal, wherein the input terminal of the delay circuit is coupled to the input terminal of the negative glitch suppressor, and wherein the output terminal of the delay circuit is coupled to the second input terminal of the NOR gate.

29. The digital circuit of claim 22 wherein the positive glitch suppressor is non-inverting.

30. The digital circuit of claim 29 wherein the positive glitch suppressor has an input terminal and an output terminal, and wherein the positive glitch suppressor includes:

an AND gate having a first input terminal, a second input terminal, and an output terminal, wherein the first input terminal of the AND gate is coupled to the input terminal of the positive glitch suppressor, and wherein the output terminal of the AND gate is coupled to the output terminal of the positive glitch suppressor; and, a delay circuit having an input terminal and an output terminal, wherein the input terminal of the delay circuit is coupled to the input terminal of the positive glitch suppressor, and wherein the output terminal of the delay circuit is coupled to the second input terminal of the AND gate.

31. The digital circuit of claim 26 wherein the positive glitch suppressor is inverting.

32. The digital circuit of claim 31 wherein the positive glitch suppressor has an input terminal and an output terminal, and wherein the positive glitch suppressor includes:

a NAND gate having a first input terminal, a second input terminal, and an output terminal, wherein the first input terminal of the NAND gate is coupled to the input terminal of the positive glitch suppressor, and wherein the output terminal of the NAND gate is coupled to the output terminal of the positive glitch suppressor; and, delay circuit having an input terminal and an output terminal, wherein the input terminal of the delay circuit is coupled to the input terminal of the positive glitch suppressor, and wherein the output terminal of the delay circuit is coupled to the second input terminal of the NAND gate.

33. The digital circuit of claim 22 wherein the digital circuit performs an inverting function.

34. The digital circuit of claim 22 wherein the digital circuit performs an AND and a NAND function.

35. The digital circuit of claim 26 wherein the digital circuit performs an OR and a NOR function.

36. The digital circuit of claim 26 wherein the digital circuit performs a storage function.

37. The digital circuit of claim 22 wherein the digital circuit comprises a latch.

38. The digital circuit of claim 22 wherein the digital circuit comprises a register.

39. The digital circuit comprising:

first, second, and third input terminals and an output terminal;

a p-channel transistor having source, drain and gate terminals;

an n-channel transistor having source, drain and gate terminals, wherein the source and drain terminals of each of the p-channel and n-channel transistors are coupled between the first input terminal and the output terminal;

a negative glitch suppressor coupled between the second input terminal and the gate of the p-channel transistor, wherein the negative glitch suppressor prevents negative glitches at the p-channel transistor; and, a positive glitch suppressor coupled between the third input terminal and the gate of the n-channel transistor, wherein the positive glitch suppressor prevents positive glitches at the n-channel transistor.

40. A digital circuit comprising:

first and second input terminals and an output terminal;

first and second p-channel transistors each having source, drain and gate terminals;

first and second n-channel transistors each having source, drain and gate terminals, wherein the output terminal is coupled to a circuit formed by the source and drain terminals of the first and second p-channel transistors and the first and second n-channel transistors;

a first negative glitch suppressor coupled between the first input terminal and the gate of the first p-channel transistor, wherein the first negative glitch suppressor prevents negative glitches at the first p-channel transistor;

a second negative glitch suppressor coupled between the second input terminal and the gate of the second p-channel transistor, wherein the second negative glitch suppressor prevents negative glitches at the second p-channel transistor;

a first positive glitch suppressor coupled between the first input terminal and the gate of the first n-channel transistor, wherein the first positive glitch suppressor prevents positive glitches at the first n-channel transistor; and, a second positive glitch suppressor coupled between the second input terminal and the gate of the second n-channel transistor, wherein the second positive glitch suppressor prevents positive glitches at the second n-channel transistor.

41. The digital circuit of claim 40 wherein the source and drain terminals of the first and second p-channel transistors are coupled in parallel, and wherein the source and drain terminals of the first and second n-channel transistors are coupled serially.

42. The digital circuit of claim 41 wherein the parallel coupled source and drain terminals of the first and second p-channel transistors form a junction with the serially coupled source and drain terminals of the first and second n-channel transistors, and wherein the output terminal is coupled to the junction.

43. A digital circuit comprising:

a p-channel comprising one or more transistors;

an n-channel comprising one or more transistors;

a negative glitch suppressor coupled to the p-channel but not to the n-channel; and, a positive glitch suppressor coupled to the n-channel but not to the p-channel.

44. The digital circuit of claim 43 wherein the digital circuit performs an inverting function.

* * * * *